US005246784A

United States Patent [19]

Fuchs et al.

[11] Patent Number: 5,246,784

[45] Date of Patent: Sep. 21, 1993

[54] ULTRATHIN THERMOSTABLE BISMALEIMIDE FILMS AND PRODUCTION THEREOF

[75] Inventors: Harald Fuchs, Carlsberg; Ulrike Licht, Mannheim; Wolfgang Schrepp, Heidelberg, all of Fed. Rep. of Germany

[73] Assignee: BASF Aktiengesellschaft, Ludwigshafen, Fed. Rep. of Germany

[21] Appl. No.: 769,439

[22] Filed: Oct. 1, 1991

[30] Foreign Application Priority Data

Oct. 9, 1990 [DE] Fed. Rep. of Germany ....... 4032004

[51] Int. Cl.[5] .......................... B32B 27/00; B05D 3/04

[52] U.S. Cl. .................................. 428/473.5; 427/340; 427/385.5; 428/220

[58] Field of Search ............................ 427/340, 385.5; 428/473.5

[56] References Cited

U.S. PATENT DOCUMENTS

| | | | |
|---|---|---|---|
| 4,393,214 | 7/1990 | Imai et al. | 546/345 |
| 4,868,281 | 9/1989 | Uekita et al. | 528/353 |
| 4,987,219 | 1/1991 | Uekita et al. | 528/353 |

FOREIGN PATENT DOCUMENTS

| | | |
|---|---|---|
| 239980 | 10/1987 | European Pat. Off. . |
| 246602 | 11/1987 | European Pat. Off. . |
| 251072 | 1/1988 | European Pat. Off. . |

OTHER PUBLICATIONS

"Molecular Engineering using the Langmuir . . . " Petty, Polymer Surfaces and Interfaces, 1987, John Wiley & Sons Ltd., 163-187.

Chem. Abst. JP 208946/86.

*Primary Examiner*—George F. Lesmes
*Assistant Examiner*—Chris Raimund
*Attorney, Agent, or Firm*—Keil & Weinkauf

[57] ABSTRACT

Ultrathin thermostable bismaleimide films are produced by converting Langmuir-Blodgett layers of ionic precursors based on bismaleamide.

9 Claims, 4 Drawing Sheets

$$^{\ominus}OOC-CH=CH-\overset{O}{\overset{\|}{C}}-NH-\text{(fluorenylidene-bis-phenylene)}-NH-\overset{O}{\overset{\|}{C}}-CH=CH-COO^{\ominus}\quad NH_3^{\oplus}(CH_2)_{17}CH_3\ (\times 2)$$

$$CH(=CH-COO^{\ominus})-\overset{O}{\overset{\|}{C}}-NH-C_6H_4-C(CH_3)_2-C_6H_4-C(CH_3)_2-C_6H_4-NH-\overset{O}{\overset{\|}{C}}-CH(=CH-COO^{\ominus})\quad NH_3^{\oplus}(CH_2)_{17}CH_3\ (\times 2)$$

$$CH(=CH-COO^{\ominus})-\overset{O}{\overset{\|}{C}}-NH-C_6H_4-O-C_6H_4-C_6H_4-O-C_6H_4-NH-\overset{O}{\overset{\|}{C}}-CH(=CH-COO^{\ominus})\quad NH_3^{\oplus}(CH_2)_{17}CH_3\ (\times 2)$$

$$^{\ominus}OOC-CH=CH-\overset{O}{\overset{\|}{C}}-NH\ \text{(naphthylene)}\ NH-\overset{O}{\overset{\|}{C}}-CH=CH-COO^{\ominus}\quad NH_3^{\oplus}(CH_2)_{17}CH_3\ (\times 2)$$

ULTRATHIN THERMOSTABLE BISMALEIMIDE FILMS AND PRODUCTION THEREOF

The present invention relates to ultrathin thermostable bismaleimide films and production thereof.

Polyimides are used in the form of thermostable films for many semiconductor applications. They can be applied as planarizer, as insulating layer or else as structurable dielectric in the form of the soluble precursor—the polyamic acid. Polyimides are also important as orienting layer in the field of liquid crystals. With applications as an insulating material in semiconductor devices, very thin, uniform layers are necessary. By spin-coating polyamide acid solutions it has hitherto not been possible to prepare layers thinner than 1 μm. To obtain even thinner layers, the Langmuir-Blodgett technique has already been used. For instance, DE-A-36 39 380, inter alia, describes the production of monomolecular films, made essentially of a polyimide, by thermal or chemical conversion of amphiphilically modified polyamic acid Langmuir-Blodgett layers.

In relation to thermostable ultrathin polymer films having a wider duty profile, it is an object of the present invention to improve them in particular in respect of the insulating properties and the capability for subsequent structuring by means of high-energy radiation or to make possible the functionalization of the surface with amines.

We have found that this object is achieved by thermostable homogeneous bismaleimide films with an adjustable thickness of less than 1 μm, obtained by converting ionic precursors formed by reaction of the reaction product of diamine and maleic anhydride with a long-chain amine into imides.

DETAILED DESCRIPTION OF THE PREFERRED EMBODIMENTS

The ionic precursors suitable for forming the bismaleimide films of the present invention are obtained by reacting a reaction product of maleic anhydride with a diamine selected from the group consisting of bis(p-aminophenyl)fluorene, bisaniline P, 4,4'-bis(p-aminophenoxy)biphenyl and 1,8-diaminonaphthalene with a long-chain amine of from 8 to 30 carbon atoms, preferably with octadecylamine or else dimethyldodecylamine.

Ionic precursors of the type defined are shown in FIG. 1 as compounds I to IV.

These substances are prepared by first synthesizing a bismaleamide. This is done by reacting solutions of the diamine and of maleic anhydride at a temperature within the range from room temperature to 80° C. in the presence of a catalyst, eg. tributylamine or diazabicyclooctane. Suitable solvents are for example N-methylpyrrolidone, N,N-dimethylpropylene urea and dimethylacetamide. The bismaleic anhydrides thus obtained are then reacted with a long-chain amine of from 8 to 30 carbon atoms, preferably with octadecylamine or else with dimethyldodecylamine, to give the ionic precursor.

The process of the present invention then comprises first spreading out a solution of the ionic precursor in an organic solvent on a water surface and using the Langmuir-Blodgett technique (Polymer Surfaces and Interfaces, eds. W.J. Feast and H.S. Munro, 1987 John Wiley & Sons Ltd., 163-187) to form a multilayer on a substrate.

Figure 1A:
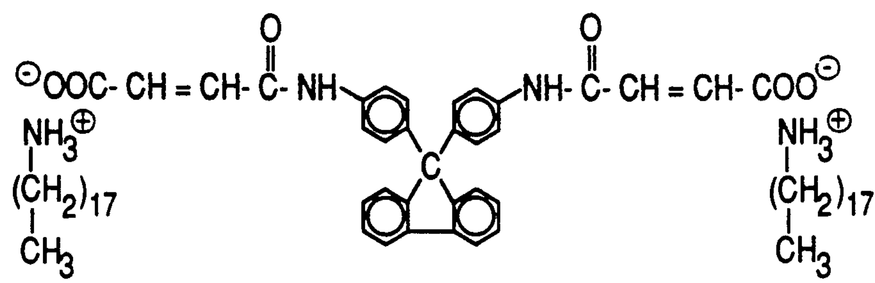
FIG. 1 shows ionic precursors suitable for forming the bismaleimide films of the present invention.
Figure 1B:
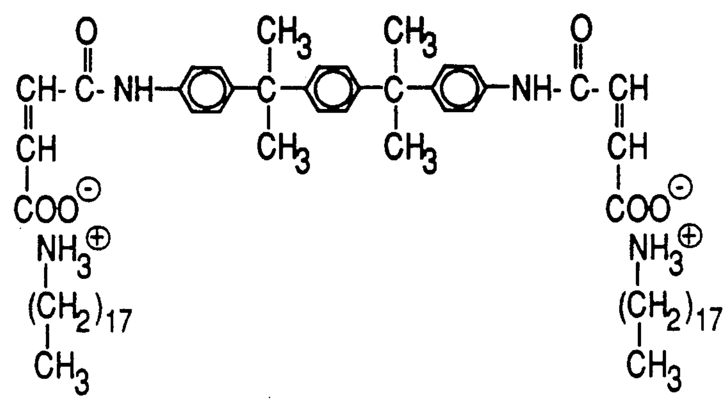
Figure 1C:
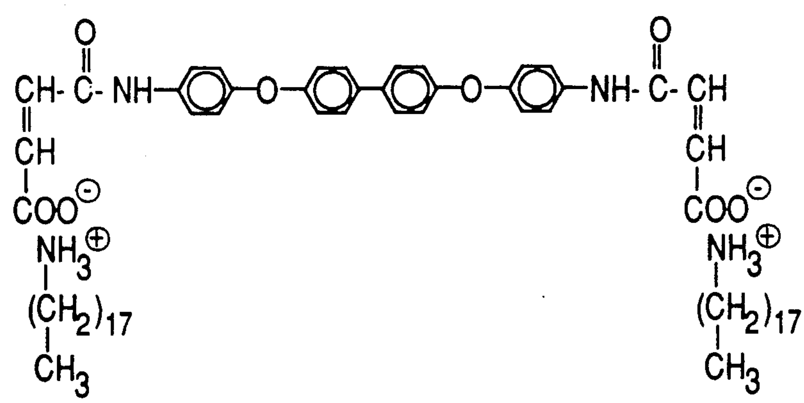
Figure 1D:
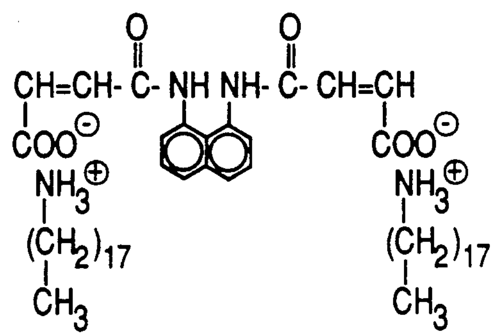
Figure 2:
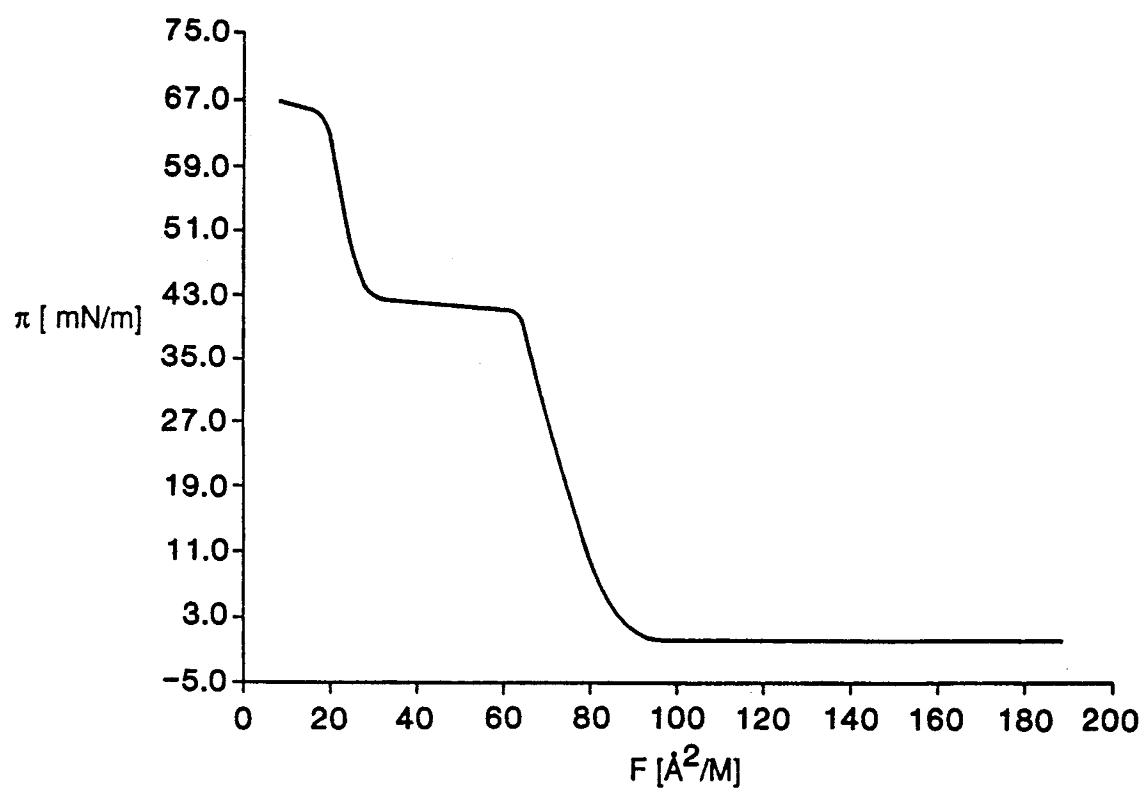
FIG. 2 shows a surface pressure vs. surface area diagram for films of the present invention.

The prerequisite for forming defined multilayers by the LB technique is the formation of a stable monolayer on the water surface of the Langmuir trough. This behavior can be characterized by means of surface-pressure vs. surface-area ($\pi$-A) diagrams (FIG. 2). These diagrams are plots of the surface pressure $\pi$, which is the difference in the surface tension between the film-free and the film-covered part of the surface of the Langmuir trough, against the available area A per molecule, in this case the area per repeat unit. The respective units are mN/m and $A^2$/molecule. A steep rise in the $\pi$-A diagram with decreasing area is favorable for transfer to a solid substrate. Furthermore, the surface film must be stable at the pressure required for transfer, ie. it must not collapse. Customarily, the pressure chosen for the transfer is distinctly below the collapsing pressure, but sufficient to ensure a surface film which is stable for a long period in the solid-analog state. Moreover, the optimal immersion and retraction speed must be determined by means of the film lift. In the present case it is from 1 to 50, preferably from 3 to 5, mm/min.

The substrates chosen for coating were predominantly silicon wafers. Multilayer transfer is also possible onto gold- alumina- or silver-coated silicon wafers or hydrophobisized glass. On these substrates the layers perform a double layer in the Y-configuration, ie. head to head and tail to tail.

The thus configured multilayers of the ionic precursors are then converted into the homogeneous bismaleimide films of the present invention. This conversion can be achieved not only thermally but also chemically. For instance, at 150–300° C. the ring closure to the imide takes place with the elimination of water. A chemical conversion to the imide is possible by treatment with a dehydrating agent. Suitable for this purpose are in particular acetic anhydride, pyridine, thionyl chloride and oxalyl dichloride. The conversion is conveniently monitored by IR spectroscopy. It is also possible to detect a reduction in the film thickness.

Figure 3:
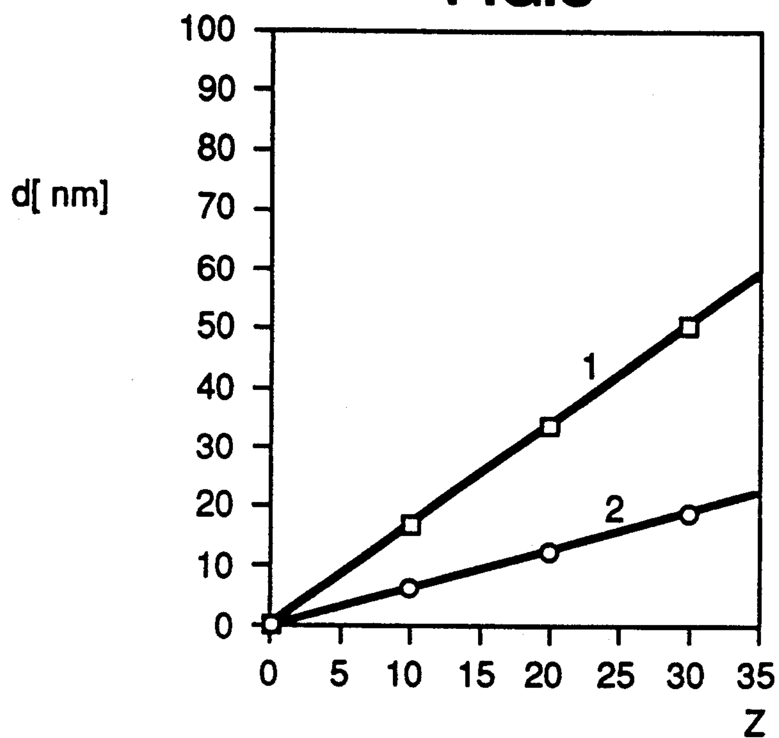
FIG. 3 shows the relationship between the number of transferred layers of ionic precursor and the thickness of the resulting multilayer.

This conversion turns the LB multilayers of the ionic precursor into the homogeneous bismaleimide films in a thickness which can be set as a function of the number of transferred layers of ionic precursor. FIG. 3 by way of example shows such a relationship between the number of layers (Z) and the thickness d of the multilayer, line 1) representing the measured thickness of the ionic precursor and line 2) the measured thickness of the resulting bismaleimide film.

In general, the process of the present invention makes it possible to obtain film thicknesses of less than 1 μm, in particular within the range from 0.3 to 500 nm.

Figure 5:
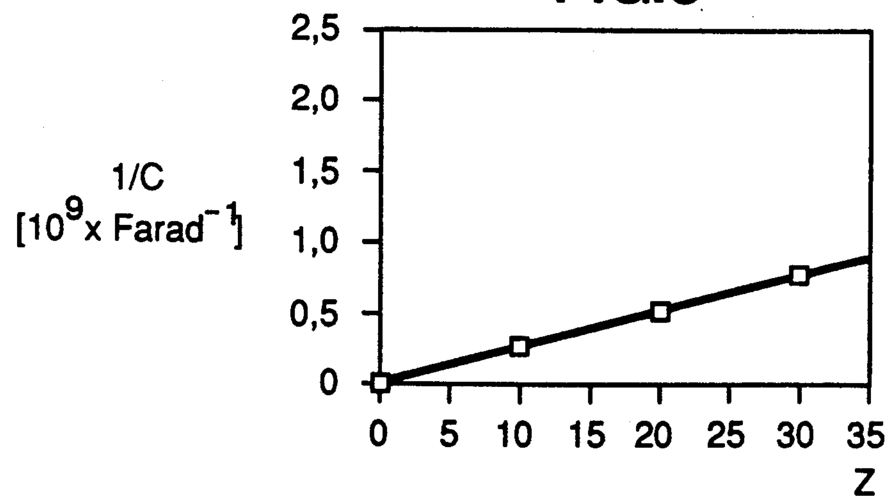
FIG. 5 shows the relationship between the capacitance of the thin films of the present invention and the number of transferred layer of ionic precursor.
Figure 4D:
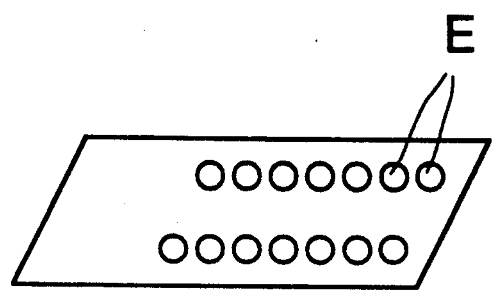
FIG. 4 shows an arrangement suitable for measuring the capacitance of thin films.
Figure 4C:
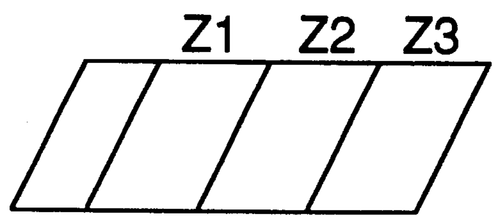
Figure 4B:
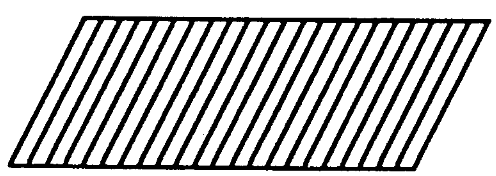
Figure 4A:
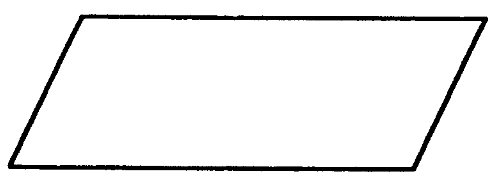

The homogeneous thermostable and ultrathin films of the present invention are particularly advantageous, on account of their dielectric properties, for insulation purposes. Measurements of the capacitance of such thin films can be carried out with an arrangement as depicted diagrammatically in FIG. 4. The silicon wafer A supports a vapor deposited silver layer B as base electrode. Then the LB layers C are applied in a varying number of layers Z1, Z2 and Z3 and a mask D is used to vapor deposit aluminum cover electrodes E. The dependence of the capacitance 1/C, in $farad^{-1} \cdot 10^9$, on the number of layers Z is shown in FIG. 5. The linear dependence of 1/C on the layer thickness testifies to defined and defect-free film transfer.

We claim:

1. A thermostable homogeneous bismaleimide film with a thickness of less than 1 μm obtained by (a) applying to a substrate as a thin film a reaction product (P) of (p1) a long-chain amine of from 8 to 30 carbon atoms with (p2) a reaction product (Q) of (q1) maleic anhydride and (q2) an aromatic diamine, and (b) converting product P into an imide wherein the aromatic diamine is selected from the group consisting of bis (p-aminophenyl fluorene, bisaniline-p 4-4′- bis (p-aminophenoxy) biphenyl and 1, 8 diaminonaphthalene.

2. A thermostable homogeneous bismaleimide film with a thickness of less than 1 μm obtained according to claim 1, wherein the long-chain amine (p1) is an aliphatic monoamine.

3. A thermostable homogeneous bismaleimide film with a thickness of less than 1 μm obtained according to claim 2, wherein the aliphatic monoamine (p1) has at least 8 carbon atoms.

4. A process for producing a thermostable homogeneous bismaleimide film by applying by means of the Langmuir-Blodgett technique a multilayer of a product (P) of (p1) a long-chain amine of from 8 to 30 carbon atoms with (p2) a reaction product (Q) of (q1) maleic anhydride and (q2) an aromatic diamine and converting the low molecular product (P) into the imide.

5. The process of claim 4, wherein the low molecular product (P) is converted into the imide by heating to 150–300° C.

6. The process of claim 4, wherein the low molecular product (P) is converted into the imide by means of a dehydrating agent.

7. The process of claim 6, wherein the dehydrating agent is acetic anhydride.

8. The process of claim 4, wherein the long-chain amine (p1) is an aliphatic monoamine.

9. The process of claim 8, wherein the aliphatic monoamine (p1) has at least 8 carbon atoms.

* * * * *